United States Patent [19]

Kickelhain et al.

[11] Patent Number: 5,955,179
[45] Date of Patent: Sep. 21, 1999

[54] COATING FOR THE STRUCTURED PRODUCTION OF CONDUCTORS ON THE SURFACE OF ELECTRICALLY INSULATING SUBSTRATES

[75] Inventors: Joerg Kickelhain, Neustadt a. Rbge.; Bruno Vitt, Aachen, both of Germany

[73] Assignee: LPKF Laser & Electronics AG, Garbsen-OT Berenbostel, Germany

[21] Appl. No.: 08/836,812

[22] PCT Filed: Sep. 18, 1996

[86] PCT No.: PCT/EP96/04074

§ 371 Date: Jul. 23, 1997

§ 102(e) Date: Jul. 23, 1997

[87] PCT Pub. No.: WO97/11589

PCT Pub. Date: Mar. 27, 1997

[30] Foreign Application Priority Data

Sep. 21, 1995 [GB] United Kingdom ............... 195 35 068

[51] Int. Cl.[6] .............................. B23K 26/00; H05K 3/02
[52] U.S. Cl. ............... 428/210; 204/192.25; 204/192.29; 204/192.35; 204/298.31; 296/84.1; 338/34; 338/35; 427/110; 427/126.1; 427/126.2; 427/126.3; 427/162; 427/165; 427/168; 427/343; 428/195; 428/336; 428/432; 428/446; 428/697; 428/699; 428/701; 428/702
[58] Field of Search ...................... 428/697, 699, 428/701, 702, 336, 432, 446, 195, 210; 338/34, 35; 65/60.5; 204/192.25, 192.29, 192.35, 298, 31; 219/203; 296/84.1; 359/359, 580, 585; 427/162, 165, 168, 343, 110, 126.1, 126.2, 126.3

[56] References Cited

U.S. PATENT DOCUMENTS

| | | | |
|---|---|---|---|
| 4,066,815 | 1/1978 | Olink et al. | 428/336 |
| 4,859,496 | 8/1989 | Toyonaga et al. | 427/53.1 |
| 4,889,974 | 12/1989 | Auding et al. | 219/543 |
| 4,900,634 | 2/1990 | Terneu et al. | 428/432 |
| 5,397,920 | 3/1995 | Tran | 257/749 |

FOREIGN PATENT DOCUMENTS 1517341  7/1978  United Kingdom .

*Primary Examiner*—Archene Turner
*Attorney, Agent, or Firm*—Evenson, McKeown, Edwards & Lenahan, P.L.L.C.

[57] ABSTRACT

A coating for the structured production of conductors on the surface of electrically insulating substrates, in particular for producing sensor elements and printed circuit boards. The coating is formed from a doped tin oxide layer having the composition $Sn_{1-(y+z)}A_yB_zO_2$, in which A is Sb or F and B is In or Al. The relative proportions in the coating of the dopants antimony (or fluorine) and indium (or aluminum) are defined by the limits $0.02<y+z<0.11$ and satisfy the condition $1.4<y/z<2.2$. The coating can be structured by ablation using electromagnetic laser radiation in the wavelength range 157–1064 nm. The creates an economical means for high resolution and waste-free structuring of insulating channels in thin, electrically conductive layers having high chemical, mechanical and thermal resistance on glass or ceramic substrates.

20 Claims, No Drawings

COATING FOR THE STRUCTURED PRODUCTION OF CONDUCTORS ON THE SURFACE OF ELECTRICALLY INSULATING SUBSTRATES

The invention relates to a coating for the structured production of conductors on the surface of electrically insulating substrates, especially for the manufacture of sensor elements and printed circuit boards, wherein the coating is formed by a doped tin oxide layer with the composition $Sn_{1-(y+z)}A_y B_z O_2$ with A=Sb or F and B=In or Al, and to a method for applying the coating.

In chip and wafer production for microsensors, for hybrid circuits, displays, etc., the structured production of conductors plays a central role. In these areas so-called "masters," (masks) are used for the structuring, which as a rule consist of glass material as the support. On this material a thin, homogeneous or inhomogeneous layer, of chromium as a rule, is vapor deposited, which then must be structured with the required layout. Also in many other areas of electronics, the structuring of thin coatings or sandwiches on chiefly glass substrates is of interest with an view to their use as conductors and wiring systems. It is already known to coat a thin metal layer about 0.1 $\mu$m to 0.2 $\mu$m thick with a varnish, which is then exposed to an electron beam or laser beam or through optical systems and developed. Then a chemical etching step follows which removes the exposed metal surfaces.

In the field of printed circuit board manufacture, DE 40 10 244 A1 has disclosed the application of a conductive varnish to a circuit board and then working out the conductor pattern from the conductive varnish with aid of a laser. The thus produced conductor pattern is subsequently metallized.

DE 39 22 478 has already disclosed structuring plastic coated, copper-laminated base material with an excimer laser, i.e., removing the plastic coating in the areas where the conductive paths are thereafter applied by electrolytic deposition of metal. Furthermore, in this semi-additive process an alternative is envisioned of after deposition of the metal, removing the copper layer remaining between the conductor paths with the excimer laser instead of by chemical etching. For this purpose, however, an unrealistically high energy density is required, among other things. For this reason alone this process is unsuitable for economical fine structuring.

The use of full-surface tin oxide coatings for thin-layer heating elements has been disclosed by EP 0 280 362 B1. A two-fold doping of tin oxide with antimony and indium is also described therein, which is said to make it possible to use such coatings in thin-layer heating elements at elevated temperatures. It is known that tin oxide coatings interact with the atmosphere ($O_2$, $H_2O$), especially at high temperatures, which can lead to considerable variations in their electric conductivity. To be able to use such coatings as electrically stable, transparent thin-layer heating elements even at high temperatures, antimony and indium are doped equimolarly, i.e., in the same amount. It is especially pointed out that these amounts must not differ from one another by more than 10%. The coatings furthermore have an antimony and indium content of 4.5 mol-% each. The antimony thereby increases the conductivity, and the indium stabilizes the crystal defects.

It is the object of the invention to provide a thin and electrically conductive coating that can be applied to glass or ceramic substrates and in which insulating channels can be directly structured with high resolution and without residue.

Because the proportion of antimony or fluorine dopants to indium or aluminum in the coating is defined by the limits 0.02<y+z<0.11 and the ratio of the dopants satisfies the condition 1.4<y/z<2.2, it is surprisingly achieved that such coatings are structurable with insulating channels with high resolution and freedom from residue by ablation by means of electromagnetic laser radiation in the wavelength range of 157 nm to 308 nm. It has furthermore been found that laser radiation in the infrared wavelength range up to 1064 nm can be used for the high-resolution structuring of the coating according to the invention. Such radiation can be produced, for example, by means of diode-pumped solid lasers. By means of an integrated frequency doubling, tripling or quadrupling, a shorter wavelength laser radiation can be produced which likewise can be used advantageously for structuring the described coating.

Furthermore, the object is achieved by a method which is characterized in that the coating is applied in a thickness between 50 nm and 500 nm to an electrically insulating substrate of glass, ceramic or a semiconducting silicon at a surface temperature of 400° C. to 600° C. by means of an aerosol spray pyrolysis method at a temperature of 400° C. to 600° C.

The fine conductive structures produced by ablation by electromagnetic laser radiation in the specified wavelength range are characterized by sharp-edged vertical walls on the insulation channels, and the coating has an extraordinarily good resistance to chemical media as well as mechanical and thermal stresses. The coatings according to the invention can find application in sensors, e.g., for moisture sensors for automobile windshields, and for conducting paths of microelectronic circuits, especially for high-frequency components on a quartz glass substrate, and as displays, for example, in combination with LCD coatings. The high conductivity and simultaneously high corrosion resistance are achieved by the special parameters of the coating process and structuring process, as well as especially by the addition of antimony (Sb) and indium (In) to tin oxide in the stated concentrations. Alternatively, if the stated concentrations are maintained, fluorine can also be used for antimony, and aluminum for indium.

It has proven to be especially advantageous if the coating has the composition: $Sn_{0.919}Sb_{0.052}In_{0.029}O_2$. It has been found, a coating of this kind in particular has an optimum electrical conductivity and can be removed by means of an excimer laser with high resolution, with no residue and with extremely sharp edges. Applied to the surface of a glass substrate, such a coating is almost metallically conductive and transparent, and also has an extraordinarily high corrosion resistance and mechanical strength.

Preferably, the coating is applied at temperatures of 400° C. to 600° C. by means of an aerosol spray pyrolysis method. The thickness of the coating lies between 50 nm and 500 nm. The subsequent structuring of the coating is performed in a preferred embodiment of the invention by ablation by means of a krypton fluoride excimer laser with a wavelength of 248 nm.

In further embodiment of the invention, the substrate is specified to be quartz glass, glass ceramic, hard glass, especially borosilicate hard glass, soft glass, ceramic, especially aluminum oxide ceramic, or semiconductive silicon.

In accordance with the invention it has become possible to use tin oxide as a semiconductor which has an energy band gap of 3.6 eV and is thus transparent to visible light, as a finely structurable coating, for sensors for example. Use is thereby made of the known effect that, by adding suitable dopants to tin oxide a density of freely moving electrons (up to virtually $10^{21}$ per $cm^3$) can be produced, which is unusually high for semiconductors. If thusly doped tin oxide is precipitated in the form of thin layers on glass substrates, these electrically insulating glasses receive a coating which has a nearly metallic conductivity and is simultaneously transparent.

It was found according to the invention that tin oxide coatings with a content of preferably 5.2 mole-% antimony and 2.9 mole-% indium can be structured precisely and without problems by means of excimer lasers, and even afterward they are stable electrochemically and mechanically. As it has been found, on the other hand, coatings doped equimolarly with antimony and indium present difficulties in regard to structuring with an excimer laser. Furthermore, the electrical conductivity and the mechanical adhesion of the coatings now used according to the invention are advantageously higher in comparison to coatings of the state of the art.

It is quite surprising that it is possible to ablate the coating used according to the invention by means of an excimer laser in a finely structured manner. Especially in the case of metals the economical use of excimer lasers for a clean ablation has appeared impossible due, among other things, to the high bonding energy. If the mechanisms of interaction of laser radiation and matter are considered, the laser wavelengths excite mainly vibration modes within the matter and thus heat metals, for example, to the molten or gaseous aggregate state. Lastly, there is a thermal ablation method which is not suitable for high-resolution structuring, especially also due to unavoidable deposition of metals. The range of economical use of the excimer laser has heretofore been limited exclusively to the ablation of polymers. Here considerable advantages can be achieved in ablation which result from the high photon energies of this laser radiation. Unlike laser radiation that acts thermally, in the case of polymers the bonding energy of the molecules is nullified and particles and monomers are split off cold. What is involved here is a non-thermal ablation process.

For the above reasons the advantages of the use of excimer lasers on doped metal oxides were in no way to be expected. In particular, the successful use of an excimer laser for the ablation of the tin oxide coatings used according to the invention was not to be expected. At any rate, the applicant's attempts toward the direct structuring of coatings similar in their properties, such as chromium nitride coatings, in order to make a moisture sensor were unsuccessful. Instead it was found that in this case, when an excimer laser is used, the evaporation of material can cause precipitation within the ablated areas. For this reason a functioning sensor previously could not be produced by means of a laser-supported ablation of material.

As it has been found surprisingly, however, a pulsed excimer laser is very well suited for the economical direct ablation of a newly developed special coating with the composition according to the invention, which is disposed on a substrate of glass or ceramic. And structuring of thin tin oxide coatings on glass or ceramic wafers is possible in the $\mu$m range with extremely high resolution and without leaving any residue. The excimer laser thereby is used for the direct structuring of such coatings either with a mask disposed in the path of the beam having areas transparent to the laser beam corresponding in shape and arrangement to the areas of the coating that are to be ablated, or else a focused laser beam is used.

The invention will be further explained below with the aid of an example.

The coating according to the invention was applied to the substrate by the aerosol spray pyrolysis method. A spray solution was atomized pneumatically to an aerosol by means of a commercial spray device. The propellant was dry nitrogen. The average diameter of the aerosol droplets was within the range of a few $\mu$m. The spray nozzle was moved by an XY transport system at a distance of 10 cm to 15 cm perpendicular to the glass substrate lying horizontally on a flat stove. The application was made after the glass disks were cleaned with a known glass cleaner. The substrates were heated in an oven to a surface temperature of about 550° C. Such a temperature proved to be especially advantageous, since the specific electrical conductivity of the applied coating generally increased markedly with rising temperature.

A spray solution according to the invention was prepared as follows: first 20 cm$^3$ of tin chloride $SnCl_4$ was dissolved in 100 cm$^3$ of n-butyl acetate. Then 2.10 g of antimony chloride $SbCl_3$ and 1.14 g of indium chloride $InCl_3$ were dissolved as dopants.

When applied the hot substrate surface, the chlorides contained in the solvent are converted primarily by hydrolysis to an oxide film with the inventive composition $Sn_{0.919}Sb_{0.052}In_{0.029}O_2$. Tin oxide film thicknesses of 140 nm to 400 nm were thereby obtained.

A borosilicate glass plate was provided with a doped tin oxide coating in a thickness of 140 nm. The surface resistance of this coating was 93 $\Omega$. This coating was further characterized by:

Crystal structure: polycrystalline, cassiterite (rutile structure)

Mean visible transmission: >85%

Refractive index: 1.95±0.03

Visual optical quality: clear, scatter-free, free of striae and point defects

Microscopically: free of cracks under 200 enlargement

Adhesion: resistant to adhesive tape and rubber eraser

Chemical stability: insoluble in water, dilute acids or alkalies (especially $HNO_3$, $H_2SO_4$, HCl; NaOH, KOH), not attacked by aqueous salt solutions (NaCl, KCl), resistant to common commercial glass cleaners, attacked only with difficulty in aqueous NaOH/KOH, resistant in the salt spray test per DIN Surface resistance stability: stable in air up to at least 400° C., no detectable change when wetted with water Temperature coefficient of surface resistance: $3 \cdot 10^{-4}$ $K^{-1}$ (referred to 20° C.)

Microhardness: No measurable increase relative to hard glass (definite hardening detected on soft glass)

The described tin oxide coating on a borosilicate substrate was structured by means of an excimer laser system in order to produce a wetness sensor—in this case a passenger car windshield wiper wash sensor.

The laser-supported structuring process is preferably characterized by the use of an excimer laser in conjunction with a mask projection. The laser system used had the following technical specifications:

| Laser type | KrF - Excimer laser |
|---|---|
| Wavelength | 248 nm |
| Pulse length | 3 to 25 ns |
| Max. pulse energy | 460 mJ |
| Average power | 70 W |
| Pulse peak power | >18 MW |
| Repeat rate | 200 Hz |
| Divergence | 2 × 3 mrad |
| Beam cross section | (7–10) × 20 mm$^2$ |
| Energy stability | +/−4% |

Alternatively, it is possible to use an excimer laser in conjunction with a focusing system. Such an apparatus technique has the advantage of very flexible structuring. Basically, both the mask projection technique and also focussed processing with an excimer laser are possible.

These techniques are known in themselves. This also applies to the possible use of a mirror deflecting system.

The material ablation of the tin oxide coatings according to the invention by means of an excimer laser proved to be problem free. Surprisingly, in particular, no precipitation of the vaporized coating material was observed in the insulating channel so that extremely fine structure could be produced, and no post-treatment was necessary. Within the insulation channels the substrate material was also ablated to a depth of 20 nm. The insulation channels within the tin oxide material are characterized by virtually perpendicular walls and sharp exposed edges. The surface resistance of the coating of the invention was about 50 Ω to 150 Ω.

A manufactured automobile windshield washer sensor was sufficiently sensitive to detect even a partial covering with fog droplets. The tests furthermore showed good resistance against dry abrasion, sufficient stability against commercial glass cleaners and car wash preparations, as well as sufficient durability in the salt-spray, environmental contamination and galvanic tests prescribed by the automobile industry.

In addition it was found that the specific electrical resistance of a tin oxide coating applied in a thickness of 140 nm to borosilicate glass had also slightly increased. This is to be attributed in part to the grain sizes of the polycrystalline coating structure which increase with increased coating thickness. Thus, in the case of a coating with a thickness of 360 nm, a surface resistance of 30 Ω was measured instead of the expected 36 Ω.

In view of the fact that laminated glass in automobile windshields is produced composed of soda-lime glass (soft glass), it was also an object of the invention to realize the above-described sensor on a soft glass substrate. The successful production of the sensor on soft glass substrates is described hereinafter as an additional embodiment of the invention. Since only the coating process requires adaptation, only the substrate-specific differences in the coating process are described.

Soft glass has, among other things, a substantially greater content of a alkali oxide, especially $Na_2O$ in comparison with hard glass. Beginning at temperatures above 450° C. sodium, as a small ion, is known to diffuse to a considerable degree at the surface of the soft glass. If at a surface temperature according to the inveniton of 500° C. to 550° C., a coating with tin oxide is commenced, an sodium-containing intermediate coating forms which, due to sodium's property of binding free electrons in tin oxide, has a high specific electrical resistance. At low coating rates a sodium-containing tin oxide coating thus is formed, which at coating thicknesses in the range of 100 nm can lead to in surface resistances in the megohm range. The existence of such transition coatings has been established spectrophotometrically.

If, however, a high coating rate of about 52 nm/min is chosen, at a coating time of 7 minutes, for example, a low-resistance, 360 nm thick coating with a surface resistance of (128±6) Ω is obtained. The coating took place in this case at a temperature of 500° C. By means of this coating a very effectively operating sensor for automobile windshields was produced. To prevent thermomechanical stresses from leading to a fracture in the glass which is to be coated, it appears advantageous in the glass industry to apply the coating immediately during the cooling phase of the production of float plate glass. The problematic reheating of soft glass sheets can thus be avoided.

Basically, the field of use of the invention is in no way limited to moisture sensors. It is also possible to produce conductive paths for electronic circuits. If desired, it is then also possible additionally to apply a galvanic or even reductive coating of the tin oxide coating according to the invention with conductive substances such as copper, gold, platinum, or the like. For conductive paths of electronic circuits, a reinforcement of this kind may be advantageous in order to reduce the resistance of the path. The n-conductive tin oxide coatings according to the invention form with these metals ohmic contacts of low resistance. Moreover, the use of quartz glass with its low dielectric losses is advantageous as a substrate for the construction of conductive structures for high-frequency circuits. In general, the tin oxide coatings according to the invention form a very stable bond with all of the substrates herein named, since a strong chemical bond to the surfaces in question is achieved.

An additional advantageous embodiment of the invention consists in the production of structures on soft glass and hard glasses for display applications. Structured tin oxide hereby serves as a transparent electrode structure for liquid crystal films (LCDs). Furthermore, use in other electrostatically controlled displays is also possible. Lastly, it also is possible to use the described structured tin oxide coating as a structured heating element. Other sensor applications in addition to moisture sensors include, for example, microstructured gas sensors. In these gas sensors in order to achieve selectivity for certain gases, the individual cells must be heated differently.

We claim:

1. An article of manufacture comprising an electrically insulating substrate having deposited thereon a doped tin oxide layer having the composition:

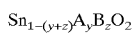

$$Sn_{1-(y+z)}A_yB_zO_2$$

wherein

A represents at least one first dopant element selected from the group consisting of Sb and F, and B represents at least one second dopant element selected from the group consisting of In and Al, and wherein the proportions of the dopants satisfy the relationships:

$$0.02 < y+z < 0.11$$

and $$1.4 < y/z < 2.2;$$

said doped tin oxide layer being selectively ablatable by targeted electromagnetic laser radiation having a wavelength in the range from 157 nm to 1064 nm to produce structured conductive paths on the substrate.

2. An article according to claim 1, wherein said doped tin oxide layer has the composition:

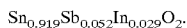

$$Sn_{0.919}Sb_{0.052}In_{0.029}O_2.$$

3. An article according to claim 1, wherein said doped tin oxide layer has a thickness in the range from 50 nm to 500 nm.

4. An article according to claim 1, wherein said doped tin oxide layer is ablatable by targeted excimer laser radiation having a wavelength in the range from 157 nm to 308 nm.

5. An article according claim 1, wherein said doped tin oxide layer is ablatable by targeted krypton-fluoride excimer laser radiation with a wavelength of 248 nm.

6. An article according to claim 1, wherein the substrate is selected from the group consisting of quartz glass, glass ceramic, hard glass, soft glass, aluminum oxide ceramic and semiconductive silicon.

7. An article according to claim 6, wherein the substrate is a hard borosilicate glass.

8. A method for producing a coated article comprising applying a layer of doped tin oxide by aerosol spray pyrolysis to an electrically insulating substrate at a surface temperature of 400° C. to 600° C., said layer having a thickness between 50 nm and 500 nm, and said doped tin oxide having a composition:

$$Sn_{1-(y+z)}A_yB_zO_2$$

wherein

A represents at least one first dopant element selected from the group consisting of Sb and F, and B represents at least one second dopant element selected from the group consisting of In and Al, and wherein the proportions of the dopants satisfy the relationships:

$$0.02 < y+z < 0.11$$

and $$1.4 < y/z < 2.2.$$

9. A method according to claim 8, wherein said doped tin oxide layer has the composition:

$$Sn_{0.919}Sb_{0.052}In_{0.029}O_2.$$

10. A method according to claim 8, wherein the substrate is selected from the group consisting of quartz glass, glass ceramic, hard glass, soft glass, aluminum oxide ceramic and semiconductive silicon.

11. A method according to claim 8, wherein the substrate is manufactured by a process which includes a cooling phase, and said doped tin oxide layer is deposited on the substrate during said cooling phase.

12. A method of producing a structured layer on a substrate, said method comprising providing an electrically insulating substrate having a layer of doped tin oxide deposited thereon, and ablating selected areas of the doped tin oxide layer by exposing the selected areas to electromagnetic laser radiation having a wavelength in the range from 157 nm to 1064 nm; said doped tin oxide layer having the composition:

$$Sn_{1-(y+z)}A_yB_zO_2$$

wherein

A represents at least one first dopant element selected from the group consisting of Sb and F, and B represents at least one second dopant element selected from the group consisting of In and Al, and wherein the proportions of the dopants satisfy the relationships:

$$0.02 < y+z < 0.11$$

and $$1.4 < y/z < 2.2.$$

13. A method according to claim 12, wherein the doped tin oxide layer has the composition:

$$Sn_{0.919}Sb_{0.052}In_{0.029}O_2.$$

14. A method according to claim 12, wherein the substrate is selected from the group consisting of quartz glass, glass ceramic, hard glass, soft glass, aluminum oxide ceramic and semiconductive silicon.

15. A method according to claim 12, wherein the doped tin oxide layer has a thickness in the range from 50 nm to 500 nm.

16. A method according to claim 12, wherein the selected areas of the doped tin oxide layer are exposed to excimer laser radiation having a wavelength in the range from 157 nm to 308 nm.

17. A method according claim 12, wherein the selected areas of the doped tin oxide layer are exposed to krypton-fluoride excimer laser radiation having a wavelength of 248 nm.

18. An article of manufacture comprising an electrically insulating substrate having a structured layer of doped tin oxide thereon produced by the process of claim 12.

19. An article of manufacture according to claim 18, wherein said article comprises a moisture sensor.

20. An article of manufacture according to claim 19, wherein said substrate comprises an automobile windshield.

* * * * *

UNITED STATES PATENT AND TRADEMARK OFFICE
CERTIFICATE OF CORRECTION

PATENT NO. : 5,955,179
DATED : September 21, 1999
INVENTOR(S) : Joerg KICKELHAIN et al.

It is certified that error appears in the above-indentified patent and that said Letters Patent is hereby corrected as shown below:

Title page, item [30] Change the Foreign Application Priority Country Code from "[GB] United Kingdom" to --[DE] Germany--.

Signed and Sealed this

Ninth Day of May, 2000

Attest:

Q. TODD DICKINSON

Attesting Officer

Director of Patents and Trademarks